US012454077B2

(12) United States Patent
Aruga et al.

(10) Patent No.: US 12,454,077 B2
(45) Date of Patent: Oct. 28, 2025

(54) DIVIDING APPARATUS

(71) Applicant: DISCO CORPORATION, Tokyo (JP)

(72) Inventors: Shinya Aruga, Tokyo (JP); Hiroaki Kobayashi, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 222 days.

(21) Appl. No.: 18/175,710

(22) Filed: Feb. 28, 2023

(65) Prior Publication Data

US 2023/0278260 A1 Sep. 7, 2023

(30) Foreign Application Priority Data

Mar. 4, 2022 (JP) ................................ 2022-033407

(51) Int. Cl.
*B28D 5/00* (2006.01)

(52) U.S. Cl.
CPC ......... *B28D 5/0064* (2013.01); *B28D 5/0023* (2013.01); *B28D 5/0052* (2013.01)

(58) Field of Classification Search
CPC ..... Y10T 83/141; Y10T 83/30; Y10T 83/307; Y10T 83/314; Y10T 83/321; Y10T 83/325; B28D 5/0064; B28D 5/0023; B28D 5/0052; B28D 5/00; B28D 5/0005; B28D 5/0017
See application file for complete search history.

(56) References Cited

U.S. PATENT DOCUMENTS

| 2008/0093025 | A1* | 4/2008 | Yamamoto | B26F 1/3846 |
| | | | | 156/764 |
| 2019/0109023 | A1* | 4/2019 | Mihai | H01L 21/687 |
| 2020/0185254 | A1* | 6/2020 | Saito | H01L 21/6836 |
| 2020/0227319 | A1 | 7/2020 | Yamamoto | |
| 2020/0266047 | A1 | 8/2020 | Kataoka et al. | |
| 2020/0333261 | A1* | 10/2020 | Sugiyama | G01N 21/9501 |

FOREIGN PATENT DOCUMENTS

| DE | 102020200257 A1 | 8/2020 |
| JP | S59125639 A | 7/1984 |
| JP | 2007123658 A | 5/2007 |

(Continued)

OTHER PUBLICATIONS

Office Action issued by the German Patent Office in corresponding DE Application No. 10 2023 201 719.9, dated Jun. 26, 2025.

(Continued)

*Primary Examiner* — Phong H Nguyen
(74) *Attorney, Agent, or Firm* — GREER BURNS & CRAIN, LTD.

(57) ABSTRACT

A dividing apparatus is provided with a second camera that forms a second image to be used for determining whether or not a wafer is divided at a first projected dicing line. That is, in the dividing apparatus, whether or not the wafer is divided at the first projected dicing line can be checked in reference to the second image. Hence, in the dividing apparatus, even in a case where part of the wafer remains at the first projected dicing line and the wafer is not divided, a dividing unit can be operated again to divide the wafer at the first projected dicing line. Consequently, in the dividing apparatus, the wafer can reliably be divided at the first projected dicing line.

9 Claims, 5 Drawing Sheets

(56) References Cited

FOREIGN PATENT DOCUMENTS

| | | |
|---|---|---|
| JP | 2013038434 A | 2/2013 |
| JP | 2019071390 A | 5/2019 |
| JP | 2019-087604 A1 | 6/2019 |
| JP | 2019-177694 A | 10/2019 |

OTHER PUBLICATIONS

Office Action issued by the Patent Office of Japan in corresponding JP Application No. 2022-033407, dated Sep. 16, 2025.

* cited by examiner

DIVIDING APPARATUS

BACKGROUND OF THE INVENTION

Field of the Invention

The present invention relates to a dividing apparatus that divides, at any one of a plurality of projected dicing lines that are set in a grid pattern, a wafer in which division initiating points are formed along the plurality of projected dicing lines and one of a first surface and a second surface is affixed to a central area of a support member that has an outer circumferential area to which an annular frame is affixed.

Description of the Related Art

Chips of devices exemplified by integrated circuits (ICs) are essential components in various kinds of electronic apparatuses such as mobile phones and personal computers. Such chips are manufactured, for example, by dividing a wafer on which a plurality of devices are formed, at boundaries of the plurality of devices.

In this kind of wafer, it is often the case that the boundaries of the plurality of devices are set in a grid pattern, and each of the plurality of linear portions included in the boundaries is also called a projected dicing line. Further, dividing the wafer is, for example, performed by forming division initiating points in the wafer along each of the plurality of projected dicing lines and then applying force to the wafer to cause cracks to extend along a thickness direction of the wafer from the division initiating points.

Examples of such division initiating points include modified portions formed inside the wafer by application of a laser beam having a wavelength transmittable through the wafer to the wafer or grooves formed on a face side or a reverse side of the wafer by grinding part of the wafer.

Further, as a method of applying force to the wafer in which division initiating points are formed, there is known a method of expanding a support member (heat shrinkable adhesive tape) affixed to a wafer, along the radial direction of the wafer (see, for example, Japanese Patent Laid-open No. 2007-123658). Yet, in this method, force is applied to the entire wafer, so that there is a risk that the wafer is not divided along some of the plurality of projected dicing lines.

In light of the abovementioned circumstance, there are proposed, as a method of dividing the wafer by locally applying force to a specific projected dicing line, a method called two-point bending (see, for example, Japanese Patent Laid-open No. 2019-71390) and a method called three-point bending (see, for example, Japanese Patent Laid-open No. 2013-38434).

SUMMARY OF THE INVENTION

Stated more simply, two-point bending is a method of dividing a wafer by pressing one of a pair of areas that are separated from each other with a projected dicing line sandwiched therebetween, in a state in which the other of the pair of areas is held. Three-point bending is a method of dividing a wafer by pressing an area of the wafer that overlaps with the projected dicing line, in a state in which each of the pair of areas that are separated from each other with the projected dicing line sandwiched therebetween is supported.

In a case where a wafer is divided by the two-point bending or the three-point bending being performed, the wafer is bent at the projected dicing line. However, when the wafer is bent, cracks that progress toward the side on which tensile stress occurs are likely to extend from the division initiating points that are formed in the wafer, while cracks that progress toward the side on which compressive stress occurs are less likely to extend from the division initiating points.

Specifically, in the case of performing the two-point bending on the wafer, cracks that progress toward the side which is to be pressed are likely to extend from the division initiating points that are formed in the wafer, while cracks that progress toward the opposite side are less likely to extend from the division initiating points. On the other hand, in the case of performing the three-point bending on the wafer, cracks that progress toward the side which is to be pressed are less likely to extend from the division initiating points that are formed in the wafer, while cracks that progress toward the opposite side are likely to extend from the division initiating points.

As such, performing either the two-point bending or the three-point bending on a wafer involves the risk of the wafer not being divided due to the cracks not extending from the division initiating points in such a manner as to penetrate the wafer. In light of these circumstances, an object of the present invention is to provide a dividing apparatus that is capable of reliably dividing a wafer at the projected dicing lines.

In accordance with an aspect of the present invention, there is provided a dividing apparatus that divides, at any one of a plurality of projected dicing lines set in a grid pattern, a wafer in which division initiating points are formed along the plurality of projected dicing line and one of a first surface and a second surface is affixed to a central area of a support member that has an outer circumferential area to which an annular frame is affixed, the dividing apparatus including a holding table that holds the frame on a holding surface formed with an opening at a center thereof, a first camera that forms a first image to be used for identifying positions of the plurality of projected dicing lines, by imaging the wafer from a side of the first surface in a state in which the frame is held on the holding surface, a dividing unit that includes a pressing section configured to divide the wafer at a first projected dicing line that is one of the plurality of projected dicing lines by pressing a portion near the first projected dicing line from a side of the other of the first surface and the second surface, and a second camera that forms a second image to be used for determining whether or not the wafer is divided at the first projected dicing line, by imaging the wafer from a side of the second surface in a state in which the frame is held on the holding surface.

Preferably, the dividing apparatus further includes a controller that controls the first camera, the dividing unit, and the second camera, and the controller includes a determination section configured to determine whether or not the wafer is divided at the first projected dicing line, in reference to the second image formed by the imaging performed by the second camera after the dividing unit is operated to divide the wafer at the first projected dicing line, and a driving section that operates the dividing unit again to divide the wafer at the first projected dicing line, in a case where the determination section determines that the wafer is not divided at the first projected dicing line.

Further, preferably, in the dividing apparatus according to the present invention, the dividing unit includes a holding section for holding the wafer from both sides of the first surface and the second surface, the holding section holds a to-be-held area of the wafer that does not overlap with the first projected dicing line and that is positioned between the first projected dicing line and a second projected dicing line adjacent to the first projected dicing line, and the pressing section presses a to-be-pressed area of the wafer that does not overlap with the first projected dicing line and that is positioned between the first projected dicing line and a third projected dicing line that is adjacent to the first projected dicing line on a side opposite a side of the second projected dicing line as viewed from the first projected dicing line. In this case, preferably, the second surface is affixed to the support member, and the pressing section presses the to-be-pressed area from the side of the first surface of the wafer.

Alternatively, in the dividing apparatus according to the present invention, the pressing section preferably presses a to-be-pressed area of the wafer that overlaps with the first projected dicing line. In this case, preferably, the first surface is affixed to the support member, and the pressing section presses the to-be-pressed area from the side of the second surface of the wafer.

Further, preferably, the dividing apparatus according to the present invention further includes a film disposing unit, and the film disposing unit includes a supply section configured to supply a film between the pressing section and the wafer and a collecting section configured to collect the film.

The dividing apparatus according to the present invention is provided with the second camera that forms the second image to be used for determining whether or not the wafer is divided at the first projected dicing line. That is, in the dividing apparatus, whether or not the wafer is divided at the first projected dicing line can be checked in reference to the second image.

Hence, in the dividing apparatus, even in a case where part of the wafer remains at the first projected dicing line and the wafer is not divided, the dividing unit can be operated again to divide the wafer at the first projected dicing line. Consequently, in the dividing apparatus, the wafer can reliably be divided at the first projected dicing line.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
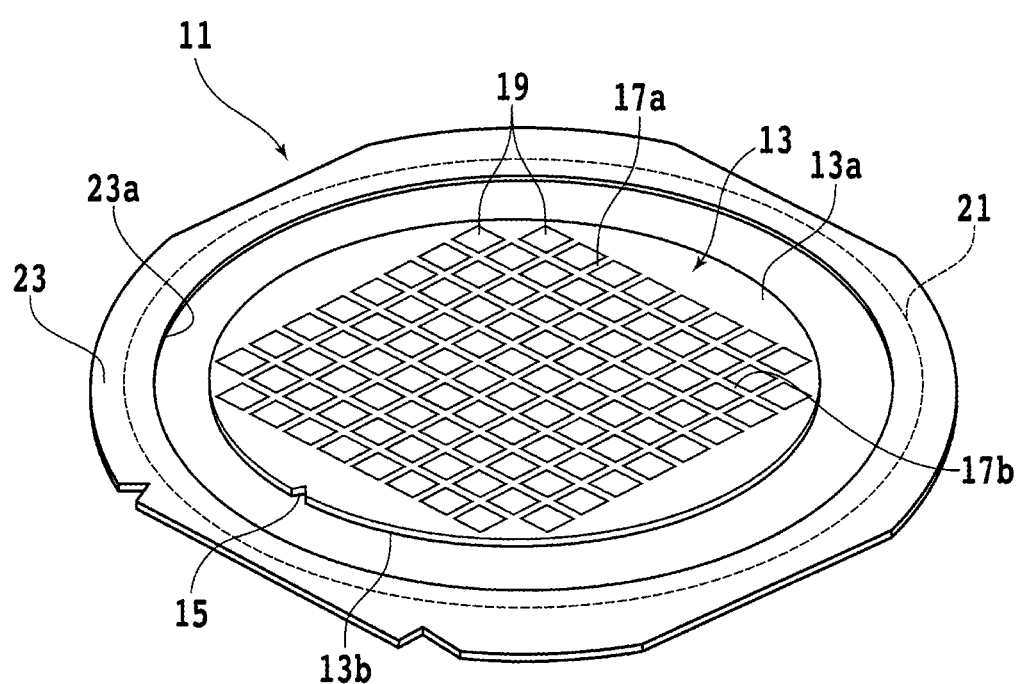
FIG. 1 is a perspective view schematically illustrating an example of a frame unit including a wafer.

An embodiment of the present invention will be described with reference to the attached drawings. FIG. 1 is a perspective view schematically illustrating an example of a frame unit. The frame unit illustrated in FIG. 1 and denoted by 11 includes a wafer 13. The wafer 13 is, for example, composed of a single-crystal semiconductor material such as silicon (Si), silicon carbide (SiC), or gallium nitride (GaN).

An outer edge of the wafer 13 is formed with a notch 15 for indicating a specific crystal orientation of the single-crystal semiconductor constituting the wafer 13. Further, part of a face side (first surface) 13a of the wafer 13 is provided with an impurity area in which impurities are doped.

The wafer 13 is demarcated into a plurality of areas by a plurality of projected dicing lines 17a that each extend along the same direction and a plurality of projected dicing lines 17b that each extend in a direction orthogonal to each of the plurality of projected dicing lines 17a. Further, in the wafer 13, division initiating points are formed along each of the plurality of projected dicing lines 17a and 17b.

In each of the plurality of areas, device 19 is formed. The device 19 includes portions of the face side 13a of the wafer (intrinsic semiconductor area in which there is no impurity and impurity area) and a stacked layer that includes various kinds of insulation films and conductive films and that is formed on the face side 13a of the wafer 13.

Note that similar stacked layers are not formed in areas of the face side 13a of the wafer 13 that overlap with the plurality of the projected dicing lines 17a and 17b. Hence, the face side 13a of the wafer 13 has a shape with recesses and protrusions. That is, in the wafer 13, the plurality of areas in which the devices 19 are formed are the protruding portions, while the areas that overlap with the plurality of projected dicing lines 17a and 17b are the recessed portions.

Further, there are not limitations on the material, the shape, a structure, a size, and the like of the wafer 13. The wafer 13 may, for example, be composed of such a material as ceramic, resin, and metal. Further, the wafer 13 may not have an impurity area. Moreover, the outer edge of the wafer 13 may be formed with a flat portion for indicating a specific crystal orientation, that is, what is generally called an orientation flat, in place of the notch 15.

To a reverse side (second surface) 13b of the wafer 13, there is affixed a central area of a circular plate-shaped support member 21 that has a longer diameter than the wafer 13. The support member 21 includes, for example, a film-like base layer having flexibility and an adhesive layer (glue layer) that is provided on one surface of the base layer (surface on the wafer 13 side). Each of the base layer and the adhesive layer is composed of a material that allows visible light to pass through.

Specifically, the base layer is composed of polyolefin (PO), polypropylene (PP), polyethylene terephthalate (PET), polyvinyl chloride (PVC), or polystyrene (PS), for example. In addition, the adhesive layer is composed of ultraviolet curable silicon rubber, an acrylic material, or an epoxy material, for example.

Alternatively, the support member 21 may be composed of only the base layer mentioned above. In this case, the reverse side 13b of the wafer 13 is, for example, affixed to the central area of the support member 21 (base layer) by thermocompression.

Further, to an outer circumferential area of the support member 21, there is affixed an annular frame 23 formed with a circular opening 23a having a longer diameter than the wafer 13. The frame 23 is, for example, composed of a ferromagnetic metal material.

Figure 2:
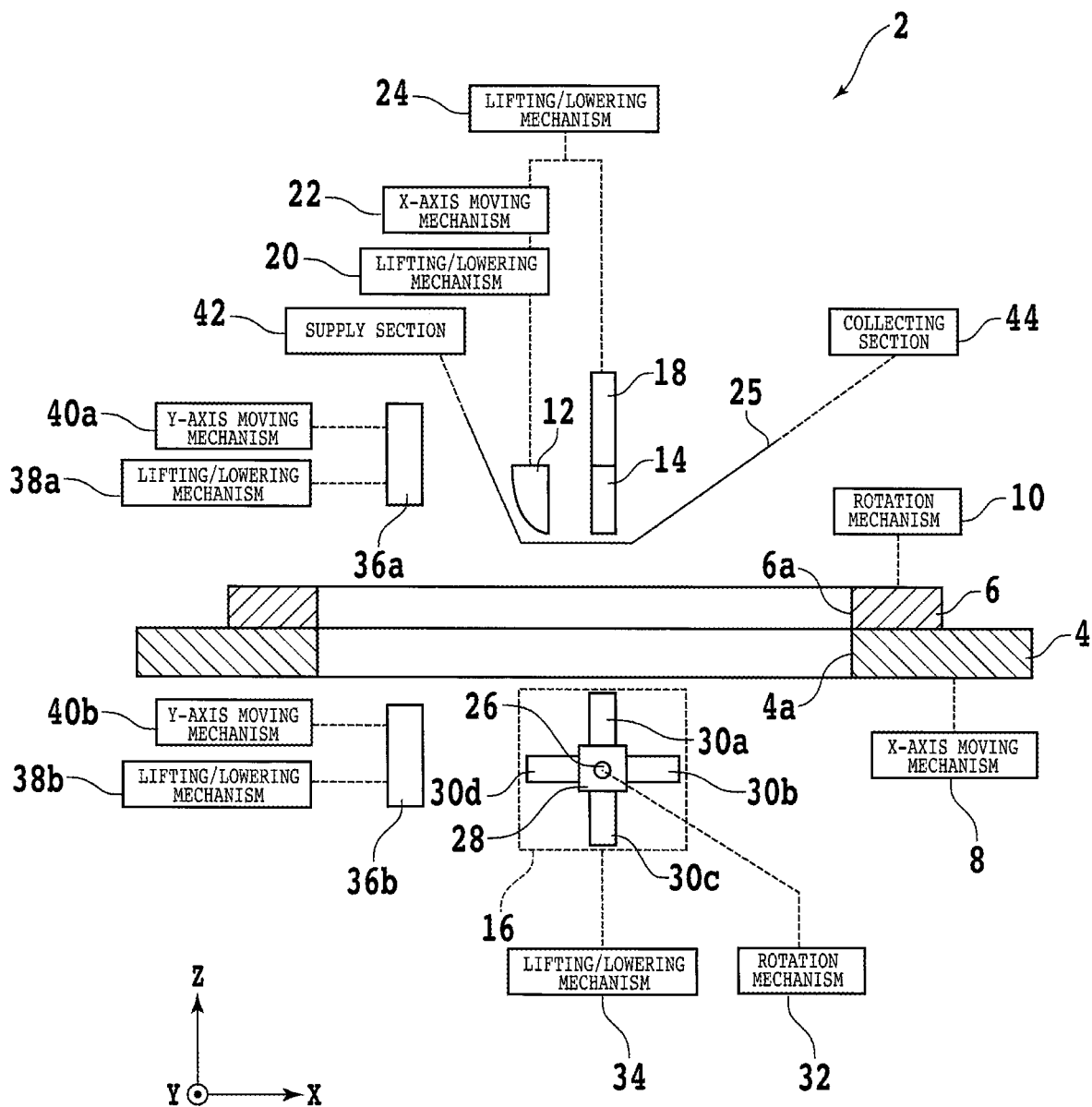
FIG. 2 is a partially cross sectional front view schematically illustrating an example of a dividing apparatus that divides the wafer at any one of a plurality of projected dicing lines.

FIG. 2 is a partially cross sectional front view schematically illustrating an example of a dividing apparatus that divides the wafer 13 included in the frame unit 11, at any one of the plurality of projected dicing lines 17a and 17b. Stated more simply, FIG. 2 schematically illustrates the structure of the components of the dividing apparatus that are directly relevant to the frame unit 11 and also illustrates, in blocks, other components of the dividing apparatus.

Note that an X-axis direction (forward-rearward direction) and a Y-axis direction (left-right direction) illustrated in FIG. 2 are directions orthogonal to each other on a horizontal plane, while a Z-axis direction (upward-downward direction; height direction) is a direction (vertical direction) orthogonal to both the X-axis direction and the Y-axis direction.

The dividing apparatus illustrated in FIG. 2 and denoted by 2 includes a flat plate-shaped X-axis moving table 4. In the center of the X-axis moving table 4, there is formed a cylindrical or prismatic opening 4a that has a width greater than the diameter of the wafer 13 but smaller than a width of the frame 23. Further, on top of the X-axis moving table 4, there is provided a holding table 6 formed with an opening 6a that has a size substantially the same as the opening 4a.

The holding table 6 is coupled to the X-axis moving table 4 in a rotatable manner along a circumferential direction thereof. The holding table 6 has an upper portion in which a permanent magnet is incorporated. Hence, when the frame 23 of the frame unit 11 is placed on an upper surface (holding surface) of the holding table 6, the frame 23 is attracted to the permanent magnet and held on the holding table 6.

The X-axis moving table 4 is coupled to an X-axis moving mechanism 8 that moves the X-axis moving table 4 and the holding table 6 along the X-axis direction. The X-axis moving mechanism 8 includes, for example, a ball screw.

The ball screw included in the X-axis moving mechanism 8 includes, for example, a screw shaft extending along the X-axis direction, numerous balls that roll over a surface of the screw shaft in association with the rotation of the screw shaft, and a nut that houses the numerous balls and that moves along the screw shaft when the numerous balls circulate inside the nut in association with the rotation of the screw shaft.

The X-axis moving mechanism 8 further includes a motor that is coupled to one end of the screw shaft and a pair of X-axis guide rails that sandwich the screw shaft and each extend along the X-axis direction. A lower side of the X-axis moving table 4 is fixed to the nut and is coupled to the upper portions of the pair of X-axis guide rails in a slidable manner.

Hence, when the motor included in the X-axis moving mechanism 8 is operated and the screw shaft is rotated, the holding table 6 moves along the pair of X-axis guide rails together with the X-axis moving table 4 fixed to the nut. That is, when the motor included in the X-axis moving mechanism 8 is operated, the X-axis moving table 4 and the holding table 6 move along the X-axis direction.

The holding table 6 is coupled to a rotation mechanism 10 that rotates the holding table 6 about a rotational axis that is a straight line passing through the center of the opening 6a and extending along the Z-axis direction. The rotation mechanism 10 includes, for example, a gear wheel having teeth that fit with the teeth formed on a lateral surface of the holding table 6. Hence, when the gear wheel included in the rotation mechanism 10 is rotated, the holding table 6 rotates.

The dividing apparatus 2 further includes a dividing unit that divides the wafer 13 included in the frame unit 11 whose frame 23 is held on the holding surface of the holding table 6. The dividing unit includes a pressing section 12 and an upper surface side holding section 14 that are disposed above the X-axis moving table 4 and the holding table 6 and a lower surface side holding section 16 that is disposed below the X-axis moving table 4 and the holding table 6.

The pressing section 12 is a structure that extends along the Y-axis direction and that has a width (length along the X-axis direction) that becomes gradually smaller toward its tip end (lower end). The upper surface side holding section 14 is a rectangular parallelepiped structure that extends along the Y-axis direction and that has a lower surface parallel to the X-axis direction and the Y-axis direction.

Above the upper surface side holding section 14, there is provided an air cylinder 18 that has a piston rod movable along the Z-axis direction. The upper portion of the upper surface side holding section 14 is fixed to a tip end (lower end) of the piston rod. Hence, when the air cylinder 18 is operated, the upper surface side holding section 14 is lifted or lowered.

The pressing section 12 is, for example, coupled to a lifting/lowering mechanism 20 that includes a support plate having a surface parallel to the Z-axis direction and a ball screw disposed on the surface of the support plate. The ball screw included in the lifting/lowering mechanism 20 includes, for example, a screw shaft extending along the Z-axis direction, numerous balls that roll over the surface of the screw shaft in association with the rotation of the screw shaft, and a nut that houses the numerous balls and that moves along the screw shaft when the numerous balls circulate inside the nut in association with the rotation of the screw shaft.

The lifting/lowering mechanism 20 includes a motor coupled to one end of the screw shaft, a pair of Z-axis guide rails that each extend along the Z-axis direction and that are fixed to the surface of the support plate in such a manner as to sandwich the screw shaft therebetween, and a Z-axis slider that is fixed to the nut and that is coupled to the pair of Z-axis guide rails in a slidable manner.

An upper portion of the pressing section 12 is fixed to the Z-axis slider included in the lifting/lowering mechanism 20. Hence, when the motor included in the lifting/lowering mechanism 20 is operated and the screw shaft is rotated, the pressing section 12 moves along the pair of Z-axis guide rails together with the Z-axis slider fixed to the nut. That is, when the motor included in the lifting/lowering mechanism 20 is operated, the pressing section 12 is lifted or lowered.

Note that, the lifting/lowering mechanism 20 including the ball screw, the motor, and the like as described above is preferable in that the position (height) of the pressing section 12 can be adjusted accurately compared to the case where the lifting/lowering mechanism 20 includes an air cylinder. The lifting/lowering mechanism 20 is, for example, further coupled to an X-axis moving mechanism 22 that includes a support plate having a lower surface parallel to the X-axis direction and the Y-axis direction and a ball screw disposed on the lower surface of the support plate.

The ball screw included in the X-axis moving mechanism 22 includes, for example, a screw shaft extending along the X-axis direction, numerous balls that roll over the surface of the screw shaft in association with the rotation of the screw shaft, and a nut that houses the numerous balls and that moves along the screw shaft when the numerous balls circulate inside the nut in association with the rotation of the screw shaft.

The X-axis moving mechanism 22 further includes a motor coupled to one end of the screw shaft, a pair of X-axis guide rails that sandwich the screw shaft and that each extend along the X-axis direction, and an X-axis slider that is fixed to the nut and that is coupled to the pair of X-axis guide rails in a slidable manner.

An upper portion of the support plate of the lifting/lowering mechanism 20 is fixed to the X-axis slider included in the X-axis moving mechanism 22. Hence, when the motor included in the X-axis moving mechanism 22 is operated and the screw shaft is rotated, the lifting/lowering mechanism 20 and the pressing section 12 move along the pair of X-axis guide rails together with the X-axis slider fixed to the nut.

That is, when the motor included in the X-axis moving mechanism 22 is operated, a distance between the pressing section 12 and the upper surface side holding section 14 along the X-axis direction increases or decreases. The air cylinder 18 and the X-axis moving mechanism 22 are coupled to a lifting/lowering mechanism 24 that includes a support plate, a ball screw, a motor, a pair of Z-axis guide rails, and a Z-axis slider. Note that the structure of the lifting/lowering mechanism 24 is similar to that of the lifting/lowering mechanism 20, and hence, description regarding the structure of the lifting/lowering mechanism 24 is omitted.

An upper portion of the air cylinder 18 and an upper portion of the support plate of the X-axis moving mechanism 22 are fixed to the Z-axis slider included in the lifting/lowering mechanism 24. Hence, when the motor included in the lifting/lowering mechanism 24 is operated, the pressing section 12, the upper surface side holding section 14, the air cylinder 18, the lifting/lowering mechanism 20, and the X-axis moving mechanism 22 are lifted or lowered.

The lower surface side holding section 16 includes a cylindrical rotation body 26 that extends along the Y-axis direction. Around the rotation body 26, a quadrangular prism-shaped rotation base 28 extending along the Y-axis direction is fixed. The rotation base 28 includes four side surfaces that are each parallel to the Y-axis direction. To the four side surfaces, base end portions of parallelepiped abutment members 30a, 30b, 30c, and 30d that have flat tip end surfaces are respectively fixed.

The four abutment members 30a, 30b, 30c, and 30d extend along the Y-axis direction, with different lengths along the Y-axis direction. Further, when each of the four abutment members 30a, 30b, 30c, and 30d is disposed to face upward, their tip end surfaces lie substantially parallel to the X-axis direction and the Y-axis direction. The tip end surface of the abutment member that is disposed to face upward (the abutment member 30a in FIG. 2) is positioned directly below the lower surface of the upper surface side holding section 14.

The rotation body 26 is coupled to a rotation mechanism 32 that includes a motor or the like. When the rotation mechanism 32 is operated, the rotation body 26, the rotation base 28, and the abutment members 30a, 30b, 30c, and 30d rotate about a rotational axis that is a straight line extending along the Y-axis direction.

The lower surface side holding section 16 is coupled to a lifting/lowering mechanism 34 that includes a support plate, a ball screw, a motor, a pair of Z-axis guide rails, and a Z-axis slider. Note that the structure of the lifting/lowering mechanism 34 is similar to those of the lifting/lowering mechanisms 20 and 24, and hence, the description regarding the structure of the lifting/lowering mechanism 34 is omitted.

The lifting/lowering mechanism 34 supports the lower surface side holding section 16 via a support base supporting the rotation body 26 in a rotational manner. A lower portion of the support base is fixed to the Z-axis slider included in the lifting/lowering mechanism 34. Hence, when the motor included in the lifting/lowering mechanism 34 is operated, the lower surface side holding section 16 is lifted or lowered.

The dividing apparatus 2 further includes a camera 36a that is disposed above the X-axis moving table 4 and the holding table 6 and a camera 36b that is disposed below the X-axis moving table 4 and the holding table 6. Each of the cameras 36a and 36b includes, for example, a visible light source such as a light emitting diode (LED), an objective lens, and an imaging device such as a charge coupled device (CCD) image sensor or a complementary metal oxide semiconductor (CMOS) image sensor.

The camera 36a forms an image by imaging an upper surface side of the wafer 13 included in the frame unit 11 whose frame 23 is held on the holding surface of the holding table 6. The camera 36b forms an image by imaging a lower surface side of the wafer 13. The camera 36a is coupled to a lifting/lowering mechanism 38a that lifts and lowers the camera 36a and a Y-axis moving mechanism 40a that moves the camera 36a along the Y-axis direction.

Similarly, the camera 36b is coupled to a lifting/lowering mechanism 38b that lifts and lowers the camera 36b and a Y-axis moving mechanism 40b that moves the camera 36b along the Y-axis direction. Each of the lifting/lowering mechanisms 38a and 38b and the Y-axis moving mechanisms 40a and 40b is, for example, a linear guide actuator that includes a ball screw and a motor that rotates the screw shaft included in the ball screw.

The dividing apparatus 2 further includes a film disposing unit that disposes, when the wafer 13 is to be pressed by the pressing section 12, a film 25 to prevent any damage to the devices 19 formed on the wafer 13. The film 25 is composed of PO, PP, PET, PVC, or PS, for example.

The film disposing unit includes a supply section 42 and a collecting section 44 that are disposed above the X-axis moving table 4 and the holding table 6. The supply section 42 includes, for example, a roller around which the film 25 is rolled and a motor that rotates the roller in such a manner as to roll out the film 25. The collecting section 44 includes a roller around which the film 25 is rolled and a motor that rotates the roller in such a manner as to roll up the film 25.

Figure 3:
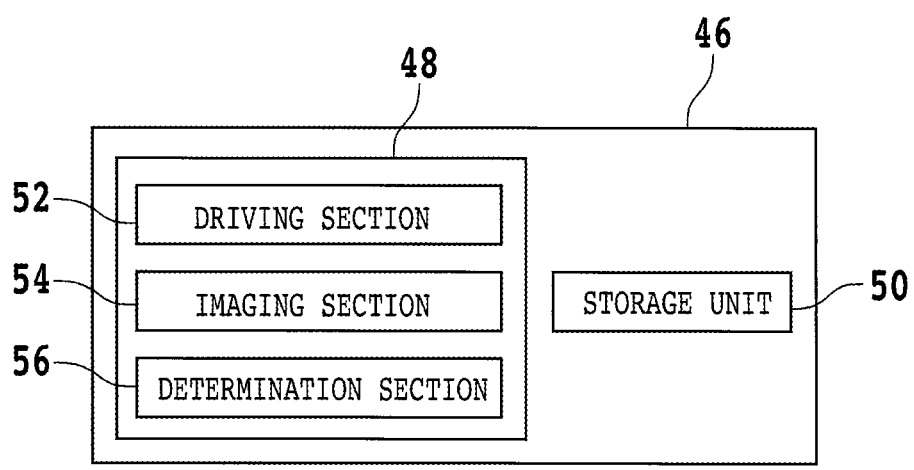
FIG. 3 is a functional block diagram schematically illustrating an example of a controller incorporated in the dividing apparatus.

The dividing apparatus 2 incorporates a controller that controls the abovementioned components. FIG. 3 is a functional block diagram schematically illustrating an example of the controller included in the dividing apparatus 2. The controller illustrated in FIG. 3 and denoted by 46 includes a processing unit 48 including a central processing unit (CPU) and the like and a storage unit 50 including a volatile memory, such as a dynamic random access memory (DRAM) or a static random access memory (SRAM), and a non-volatile memory, such as a solid state drive (SSD) (Not AND (NAND) flash memory) or a hard disk drive (HDD) (magnetic storage device).

The storage unit 50 stores various kinds of information (data, programs, and the like) to be used in the processing unit 48. The processing unit 48 reads and executes various kinds of programs stored in the storage unit 50 and generates signals for controlling the components of the dividing apparatus 2.

For example, the processing unit 48 includes a driving section 52 that generates signals for controlling movement or rotation of the components of the dividing apparatus 2, an imaging section 54 that generates signals for controlling imaging performed by the cameras 36a and 36b, and a determination section 56 that performs determination in reference to the images formed by the imaging performed by the cameras 36a and 36b.

In the following description, an example of a method of dividing the wafer 13 included in the frame unit 11 in the dividing apparatus 2 will be described with reference to FIGS. 4A to 4C. Specifically, in the following description, an example of a method of dividing the wafer 13 at a first projected dicing line 27 that is one of the plurality of projected dicing lines 17a and 17b by pressing a portion near the first projected dicing line 27 by the pressing section 12 will be described.

In the present specification, the portion near the first projected dicing line 27 refers to an area between a pair of projected dicing lines (second projected dicing line 29 and third projected dicing line 31) that sandwich the first projected dicing line 27 and that extend parallel to the first projected dicing line 27.

In this method, first, the driving section 52 operates the X-axis moving mechanism 8 to position the holding table 6 to a location where the frame unit 11 can be delivered. Next, the frame 23 is placed on the holding table 6 with the support member 21 interposed therebetween. As a result, the frame 23 is attracted to the permanent magnet incorporated in the upper portion of the holding table 6 and is held on the holding table 6 in a state in which the face side 13a of the wafer 13 is facing upward.

Next, the driving section 52 operates the X-axis moving mechanism 8, the lifting/lowering mechanism 38a, and/or the Y-axis moving mechanism 40a to position an area of the face side 13a of the wafer 13 that overlaps with the first projected dicing line 27 to a location where the area can be imaged by the camera 36a. Subsequently, the imaging section 54 controls the camera 36a to image the area.

Then, in reference to the image formed by the imaging performed by the camera 36a, the determination section 56 identifies the direction in which the first projected dicing line 27 set in the wafer 13 extends and the length thereof, as well as the distance between the second projected dicing line 29 and the third projected dicing line 31 that are adjacent to each other with the first projected dicing line 27 sandwiched therebetween.

Next, the driving section 52 operates the rotation mechanism 10 with reference to the direction in which the first projected dicing line 27 extends and that has been identified by the determination section 56, to rotate the holding table 6 in such a manner that the first projected dicing line 27 lies parallel to the Y-axis direction.

Subsequently, the driving section 52 operates the rotation mechanism 32 with reference to the length of the first projected dicing line 27 that has been identified by the determination section 56, to rotate the rotation body 26 in such a manner that a suitable one of the four abutment members 30a, 30b, 30c, and 30d faces upward. For example, the rotation body 26 is rotated in such a manner that the shortest of those of the four abutment members 30a, 30b, 30c, and 30d that are longer than the first projected dicing line 27 in the Y-axis direction faces upward.

Then, the driving section 52 operates the X-axis moving mechanism 22 with reference to the distance between the second projected dicing line 29 and the third projected dicing line 31 that has been identified by the determination section 56, to adjust the distance between the pressing section 12 and the upper surface side holding section 14. For example, the distance between the pressing section 12 and the upper surface side holding section 14 is adjusted in such a manner that the distance between the pressing section 12 and the upper surface side holding section 14 becomes shorter than the distance between the second projected dicing line 29 and the third projected dicing line 31.

Figure 4A:
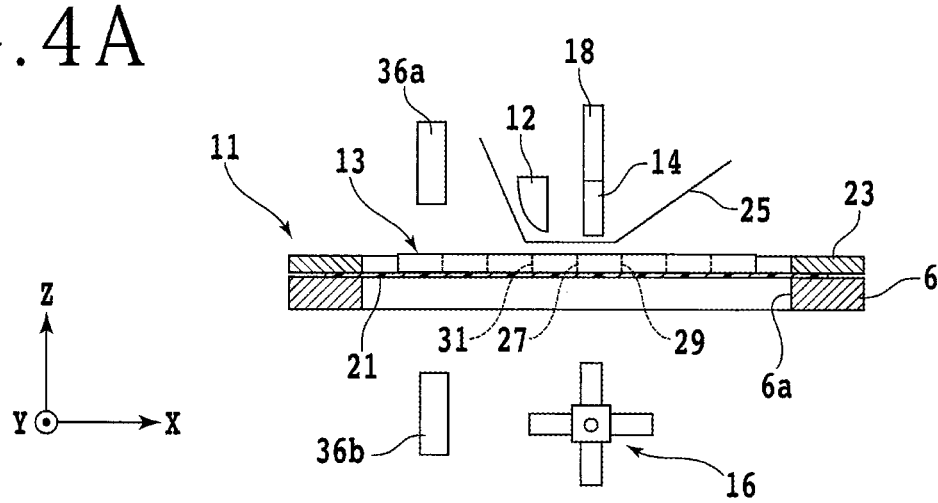
FIG. 4A is a partially cross sectional front view schematically illustrating a manner of dividing the wafer included in the frame unit at a first projected dicing line in the dividing apparatus.
Figure 4B:
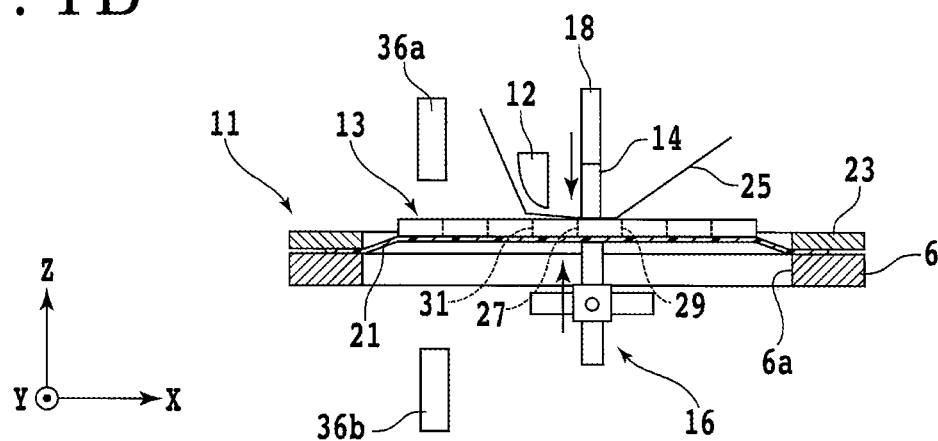
FIG. 4B is a partially cross sectional front view schematically illustrating the manner of dividing the wafer included in the frame unit at the first projected dicing line in the dividing apparatus.

Next, the driving section 52 operates the X-axis moving mechanism 8 to position the first projected dicing line 27 to an intermediate position between the pressing section 12 and the upper surface side holding section 14 in plan view (see FIG. 4A). Subsequently, the driving section 52 operates the motor included in the supply section 42 of the film disposing unit, to cause the film 25 to come into contact with the wafer 13.

Subsequently, the driving section 52 operates the air cylinder 18 and the lifting/lowering mechanism 34 to push up the wafer 13 by the lower surface side holding section 16 and sandwich the wafer 13 by the upper surface side holding section 14 and the lower surface side holding section 16 (see FIG. 4B). As a result, an area (to-be-held area) of the wafer 13 that does not overlap with the first projected dicing line 27 and that is positioned between the first projected dicing line 27 and the second projected dicing line 29 is held from both sides, i.e., the face side 13a and the reverse side 13b, at an upper side of the holding surface of the holding table 6.

Figure 4C:
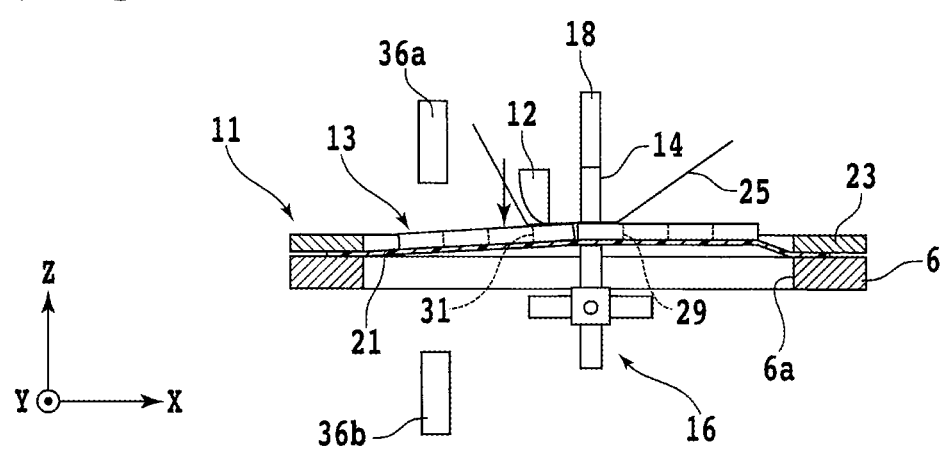
FIG. 4C is a partially cross sectional front view schematically illustrating the manner of dividing the wafer included in the frame unit at the first projected dicing line in the dividing apparatus.

Next, the driving section 52 operates the lifting/lowering mechanism 20 to press, by the pressing section 12 via the film 25, an area (to-be-pressed area) of the wafer 13 that does not overlap with the first projected dicing line 27 and that is positioned between the first projected dicing line 27 and the third projected dicing line 31 (see FIG. 4C). As a result, the wafer 13 is bent at the first projected dicing line 27, and cracks extend along a thickness direction of the wafer 13 from division initiating points formed along the first projected dicing line 27.

Subsequently, the driving section 52 operates the air cylinder 18 and the lifting/lowering mechanisms 20 and 34 to separate the pressing section 12, the upper surface side holding section 14, and the lower surface side holding section 16 away from the wafer 13. Then, the driving section 52 operates the motor included in the collecting section 44 of the film disposing unit, to separate the film 25 away from the wafer 13.

Next, the driving section 52 operates the X-axis moving mechanism 8, the lifting/lowering mechanism 38b, and/or the Y-axis moving mechanism 40b to position an area of the reverse side 13b of the wafer 13 that overlaps with the first projected dicing line 27 to a location where the area can be imaged by the camera 36b. Then, the imaging section 54 controls the camera 36b to image the area.

Subsequently, in reference to the image formed by the imaging performed by the camera 36b, the determination section 56 determines whether or not the wafer 13 is divided at the first projected dicing line 27. For example, the determination section 56 determines that the wafer 13 is divided at the first projected dicing line 27 in a case where there are cracks extending along the first projected dicing line 27 in the reverse side 13b of the wafer 13.

Note that, in a case of dividing the wafer 13 by the abovementioned method called two-point bending, tensile stress occurs on the side (upper surface; face side 13a) of the wafer 13 that is pressed, while compressive stress occurs on the opposite side (lower surface; reverse side 13b). In this case, cracks that progress toward the face side 13a of the wafer 13 are likely to extend, while cracks that progress toward the reverse side 13b are less likely to extend. Hence, in a case where there are cracks extending along the first projected dicing line 27 in the reverse side 13b of the wafer 13, the wafer 13 can be determined to be divided at the first projected dicing line 27.

In a case where the determination section 56 determines that the wafer 13 is divided at the first projected dicing line 27, the operation for dividing the wafer 13 at the first projected dicing line 27 is completed. On the other hand, in a case where the determination section 56 determines that the wafer 13 is not divided at the first projected dicing line 27, the abovementioned operation is repeated until the determination section 56 determines that the wafer 13 is divided at the first projected dicing line 27.

That is, in this case, holding the wafer 13 by the upper surface side holding section 14 and the lower surface side holding section 16, pressing the wafer 13 by the pressing section 12, and imaging the reverse side 13b of the wafer 13 by the camera 36b are repeated. Note that, in the operation to be performed for the second and subsequent times, the operation conditions of the components of the dividing apparatus 2 may be changed such that the wafer 13 can be divided more easily at the first projected dicing line 27.

For example, the driving section 52 may operate the lifting/lowering mechanism 20 in such a manner that the position where the pressing section 12 is to be located at the time of pressing the wafer 13 via the film 25 becomes gradually lower. Alternatively, the driving section 52 may operate the lifting/lowering mechanism 34 in a such a manner that the position where the lower surface side holding section 16 is to be located at the time of pushing up the wafer 13 via the support member 21 gradually becomes higher. That is, the driving section 52 may operate the air cylinder 18 and the lifting/lowering mechanism 34 in such a manner that the position where the wafer 13 is to be sandwiched by the upper surface side holding section 14 and the lower surface side holding section 16 becomes gradually higher.

The abovementioned dividing apparatus 2 includes the camera 36b that forms an image to be used for determining whether or not the wafer 13 is divided at the first projected dicing line 27. That is, in the dividing apparatus 2, whether or not the wafer 13 is divided at the first projected dicing line 27 can be checked in reference to an image formed by the camera 36b.

Hence, in the dividing apparatus 2, even in a case where part of the wafer 13 remains at the first projected dicing line 27 and the wafer 13 is not divided, the dividing unit (the pressing section 12, the upper surface side holding section 14, and the lower surface side holding section 16) can be operated again to divide the wafer 13 at the first projected dicing line 27. Consequently, in the dividing apparatus 2, the wafer 13 can reliably be divided at the first projected dicing line 27.

Note that the details described above represent one mode of the present invention, and the contents of the present invention are not limited to the details described above. For example, in the dividing apparatus 2, the wafer 13 whose face side 13a is affixed to the support member 21 may be divided at the first projected dicing line 27.

The devices 19 formed on the wafer 13 may be power devices. In this case, a metal film for supplying a ground potential to the devices 19 may be formed on the reverse side 13b of the wafer 13. This metal film has, for example, a shape that covers the entire area of the reverse side 13b.

Here, in a case where such a metal film is formed on the reverse side 13b of the wafer 13, it becomes difficult to bend and divide the wafer 13 at the first projected dicing line 27. Specifically, it becomes highly likely that, when the wafer 13 is bent, the metal film plastically deforms at the first projected dicing line 27 but remains without being divided.

In contrast, in the dividing apparatus 2, the wafer 13 can reliably be divided at the first projected dicing line 27 as described above. Hence, the dividing apparatus 2 is suitable for dividing the wafer 13 on which such a metal film is formed, at the first projected dicing line 27.

In a case of dividing the wafer 13 which has such a metal film formed on the reverse side 13b in the dividing apparatus 2, preferably, the face side 13a of the wafer 13 is affixed to the support member 21. In this case, the frame unit 11 is delivered to the dividing apparatus 2 in such a manner that the frame 23 is held via the support member 21, that is, the reverse side 13b of the wafer 13 faces upward.

In this case, when the wafer 13 is pressed by the pressing section 12 via the film 25, a strong tensile stress occurs on the metal film that is formed on the reverse side 13b of the wafer 13. Hence, in this case, the wafer 13 can easily be divided at the first projected dicing line 27.

Note that, in this case, the camera 36a that is positioned above the holding table 6 can image the reverse side 13b of the wafer 13 and the camera 36b that is positioned below the holding table 6 can image the face side 13a of the wafer 13.

Hence, in this case, the image formed by the imaging performed by the camera 36a is used to determine whether or not the wafer 13 is divided at the first projected dicing line 27, while the image formed by the imaging performed by the camera 36b is used to identify the position of the first projected dicing line 27.

Figure 5:
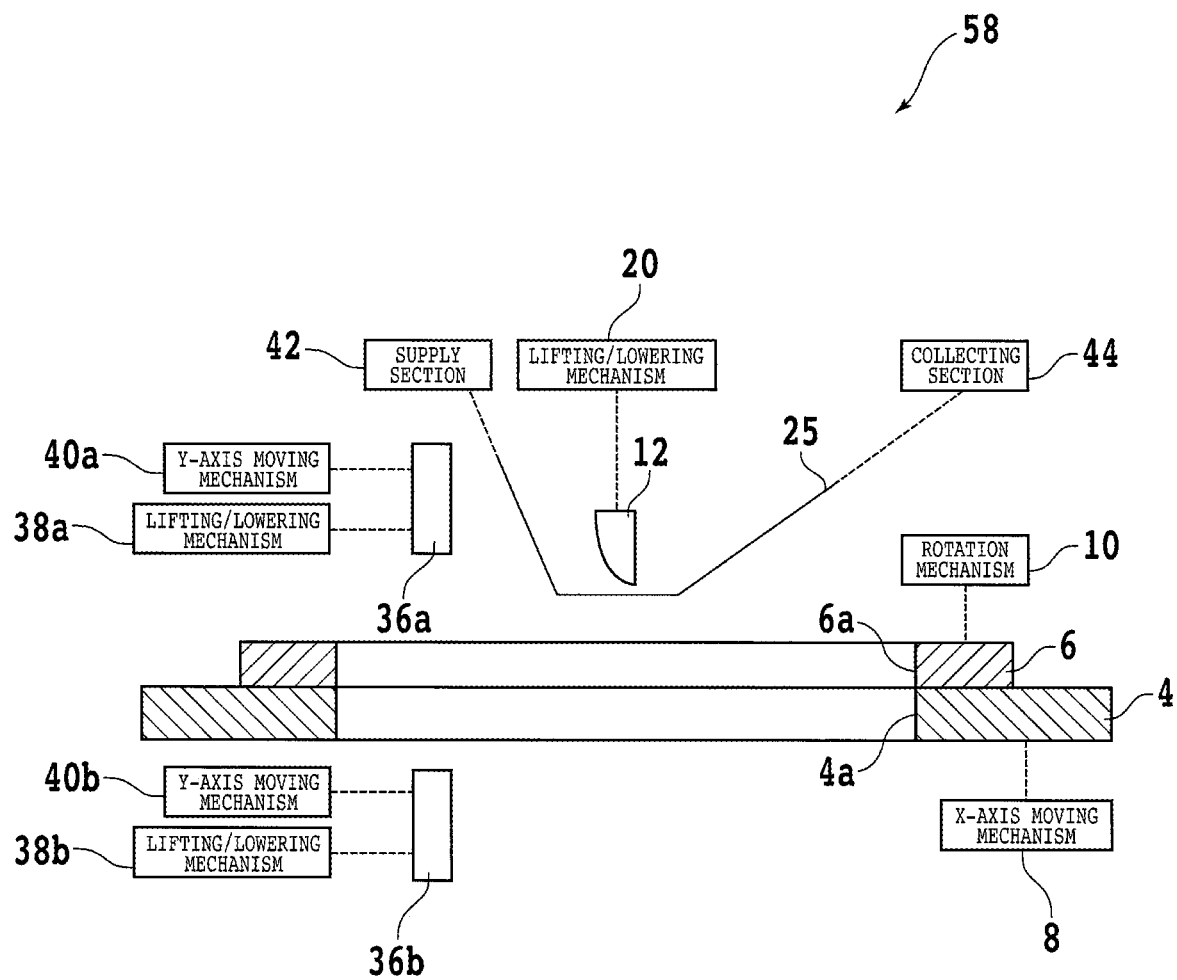
FIG. 5 is a partially cross sectional front view schematically illustrating another example of a dividing apparatus that divides the wafer at any one of a plurality of projected dicing lines.

Further, the dividing apparatus according to the present invention may be an apparatus that bends and divides the wafer 13 at the first projected dicing line 27 by the method called three-point bending. FIG. 5 is a partially cross sectional front view schematically illustrating an example of such a dividing apparatus.

Stated more simply, the dividing apparatus illustrated in FIG. 5 and denoted by 58 includes the components of the dividing apparatus 2 except the upper surface side holding section 14, the lower surface side holding section 16, the air cylinder 18, the X-axis moving mechanism 22, the lifting/lowering mechanism 24, the rotation mechanism 32, and the lifting/lowering mechanism 34. In the dividing apparatus 58, for example, the wafer 13 whose face side 13a is affixed to the support member 21 is divided at the first projected dicing line 27.

When the wafer 13 is to be divided at the first projected dicing line 27, first, the driving section 52 operates the X-axis moving mechanism 8 to position the holding table 6 to a location where the frame unit 11 including the wafer 13 can be delivered. Next, the frame 23 is placed on the holding table 6 with the support member 21 interposed therebetween. As a result, the frame 23 is attracted to the permanent magnet incorporated in the upper portion of the holding table 6 and is held on the holding table 6 in a state in which the reverse side 13b of the wafer 13 is facing upward.

Subsequently, the driving section 52 operates the X-axis moving mechanism 8, the lifting/lowering mechanism 38*b*, and/or the Y-axis moving mechanism 40*b* to position an area of the face side 13*a* of the wafer 13 that overlaps with the first projected dicing line 27 to a location where the area can be imaged by the camera 36*b*. Then, the imaging section 54 controls the camera 36*b* to image the area.

Next, in reference to the image formed by the imaging performed by the camera 36*b*, the determination section 56 identifies the direction in which the first projected dicing line 27 set in the wafer 13 extends. Subsequently, the driving section 52 operates the rotation mechanism 10 with reference to the direction in which the first projected dicing line 27 extends and that has been identified by the determination section 56, to rotate the holding table 6 in such a manner that the first projected dicing line 27 lies parallel to the Y-axis direction.

Then, the driving section 52 operates the X-axis moving mechanism 8 to position the first projected dicing line 27 directly below the pressing section 12 in plan view. Next, the driving section 52 operates the motor included in the supply section 42 of the film disposing unit, to cause the film 25 to come into contact with the wafer 13.

Subsequently, the driving section 52 operates the lifting/lowering mechanism 20 to press, by the pressing section 12 via the film 25, an area (to-be-pressed area) of the wafer 13 that overlaps with the first projected dicing line 27. As a result, the wafer 13 is bent at the first projected dicing line 27, and cracks extend along the thickness direction of the wafer 13 from the division initiating points formed along the first projected dicing line 27.

Then, the driving section 52 operates the lifting/lowering mechanism 20 to separate the pressing section 12 away from the wafer 13. Next, the driving section 52 operates the motor included in the collecting section 44 of the film disposing unit, to separate the film 25 away from the wafer 13.

Then, the driving section 52 operates the X-axis moving mechanism 8, the lifting/lowering mechanism 38*a*, and/or the Y-axis moving mechanism 40*a* to position an area of the reverse side 13*b* of the wafer 13 that overlaps with the first projected dicing line 27 to a location where the area can be imaged by the camera 36*a*. Subsequently, the imaging section 54 controls the camera 36*a* to image the area.

Then, in reference to the image formed by the imaging performed by the camera 36*a*, the determination section 56 determines whether or not the wafer 13 is divided at the first projected dicing line 27. For example, the determination section 56 determines that the wafer 13 is divided at the first projected dicing line 27 in a case where there are cracks extending along the first projected dicing line 27 in the reverse side 13*b* of the wafer 13.

Note that, in the case of dividing the wafer 13 by the abovementioned method called three-point bending, compressive stress occurs on the side (upper surface; reverse side 13*b*) of the wafer 13 that is pressed, while tensile stress occurs on the opposite side (lower surface; face side 13*a*). In this case, cracks that progress toward the face side 13*a* of the wafer 13 are likely to extend, while cracks that progress toward the reverse side 13*b* of the wafer 13 are less likely to extend. Hence, in a case where there are cracks extending along the first projected dicing line 27 in the reverse side 13*b* of the wafer 13, the wafer 13 can be determined to be divided at the first projected dicing line 27.

In a case where the determination section 56 determines that the wafer 13 is divided at the first projected dicing line 27, the operation for dividing the wafer 13 at the first projected dicing line 27 is completed. On the other hand, in a case where the determination section 56 determines that the wafer 13 is not divided at the first projected dicing line 27, the abovementioned operation is repeated until the determination section 56 determines that the wafer 13 is divided at the first projected dicing line 27.

That is, in this case, pressing the wafer 13 by the pressing section 12 and imaging the reverse side 13*b* of the wafer 13 by the camera 36*a* are repeated. Note that, in the operation to be performed for the second and subsequent times, the operation conditions of the components of the dividing apparatus 58 may be changed such that the wafer 13 can be divided more easily at the first projected dicing line 27. For example, the driving section 52 may operate the lifting/lowering mechanism 20 in such a manner that the position where the pressing section 12 is to be located at the time of pressing the wafer 13 via the film 25 becomes gradually lower.

The abovementioned dividing apparatus 58 includes the camera 36*a* that forms an image to be used for determining whether or not the wafer 13 is divided at the first projected dicing line 27. That is, in the dividing apparatus 58, whether or not the wafer 13 is divided at the first projected dicing line 27 can be checked in reference to the image formed by the camera 36*a*.

Hence, in the dividing apparatus 58, even in the case where part of the wafer 13 remains at the first projected dicing line 27 and the wafer 13 is not divided, the dividing unit (the pressing section 12 and others) can be operated again to divide the wafer 13 at the first projected dicing line 27. As a result, in the dividing apparatus 58, the wafer 13 can reliably be divided at the first projected dicing line 27.

Further, the dividing apparatus 58 may be provided with a support base that is positioned at a height substantially equal to that of the holding surface of the holding table 6 and that includes an upper surface formed with an opening extending along the Y-axis direction at the center thereof. The width (length along the X-axis direction) of the opening of the support base is, for example, smaller than the distance between the second projected dicing line 29 and the third projected dicing line 31. In the dividing apparatus 58 including the support base, the wafer 13 is divided in a state in which an area of the wafer 13 that overlaps with the first projected dicing line 27 is positioned above the opening of the support base.

That is, in the dividing apparatus 58, for example, the area (to-be-pressed area) of the wafer 13 that overlaps with the first projected dicing line 27 is pressed in a state in which an area of the wafer 13 that overlaps with the second projected dicing line 29 and an area of the wafer 13 that overlaps with the third projected dicing line 31 are supported on the support base. In this case, the wafer 13 is pressed in a state in which the portion near the to-be-pressed area is supported on the support base, so that force can be locally applied to the to-be-pressed area. Hence, in this case, the wafer 13 can easily be divided at the first projected dicing line 27.

Further, in the dividing apparatus according to the present invention, there are no limitations on the structure of the holding table 6 as long as the frame 23 can be held. For example, in place of or in addition to the permanent magnet incorporated in the upper portion of the holding table 6, clamps for grasping the frame 23 at the holding surface of the holding table 6 may be provided around the holding table 6.

In addition, structures, methods, and other matters according to the embodiment described above can appropriately be modified and implemented unless they deviate from the scope of object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A dividing apparatus that divides, at any one of a plurality of projected dicing lines set in a grid pattern, a wafer in which division initiating points are formed along the plurality of projected dicing line and one of a first surface and a second surface is affixed to a central area of a support member that has an outer circumferential area to which an annular frame is affixed, the dividing apparatus comprising:
   a holding table that holds the frame on a holding surface formed with an opening at a center thereof;
   a first camera that forms a first image to be used for identifying positions of the plurality of projected dicing lines, by imaging the wafer from a side of the first surface in a state in which the frame is held on the holding surface;
   a dividing unit that includes a pressing section configured to divide the wafer at a first projected dicing line that is one of the plurality of projected dicing lines by pressing a portion near the first projected dicing line from a side of the other of the first surface and the second surface;
   a second camera that forms a second image to be used for determining whether or not the wafer is divided at the first projected dicing line, by imaging the wafer from a side of the second surface in a state in which the frame is held on the holding surface; and
   a controller that controls the first camera, the dividing unit, and the second camera,
   wherein the controller includes:
      a determination section configured to determine whether or not the wafer is divided at the first projected dicing line, in reference to the second image formed by the imaging performed by the second camera after the dividing unit is operated to divide the wafer at the first projected dicing line, and
      a driving section that operates the dividing unit again to divide the wafer at the first projected dicing line, in a case where the determination section determines that the wafer is not divided at the first projected dicing line.

2. The dividing apparatus according to claim 1, wherein:
   the dividing unit includes a holding section for holding the wafer from both sides of the first surface and the second surface,
   the holding section holds a to-be-held area of the wafer that does not overlap with the first projected dicing line and that is positioned between the first projected dicing line and a second projected dicing line adjacent to the first projected dicing line, and
   the pressing section presses a to-be-pressed area of the wafer that does not overlap with the first projected dicing line and that is positioned between the first projected dicing line and a third projected dicing line that is adjacent to the first projected dicing line on a side opposite a side of the second projected dicing line as viewed from the first projected dicing line.

3. The dividing apparatus according to claim 2, wherein:
   the second surface is affixed to the support member, and
   the pressing section presses the to-be-pressed area from the side of the first surface of the wafer.

4. The dividing apparatus according to claim 1, wherein the pressing section presses a to-be-pressed area of the wafer that overlaps with the first projected dicing line.

5. The dividing apparatus according to claim 4, wherein:
   the first surface is affixed to the support member, and
   the pressing section presses the to-be-pressed area from the side of the second surface of the wafer.

6. The dividing apparatus according to claim 1, further comprising:
   a film disposing unit,
   wherein the film disposing unit includes:
      a supply section configured to supply a film between the pressing section and the wafer, and
      a collecting section configured to collect the film.

7. The dividing apparatus according to claim 6, wherein the supply section of the film disposing unit is positioned on one side of the pressing section and the collecting section of the film disposing unit is positioned on an opposite side of the pressing section such that the film comes into contact with the wafer at an area between the pressing section and the wafer when passing from the supply section to the collecting section.

8. A dividing apparatus that divides, at any one of a plurality of projected dicing lines set in a grid pattern, a wafer in which division initiating points are formed along the plurality of projected dicing line and one of a first surface and a second surface is affixed to a central area of a support member that has an outer circumferential area to which an annular frame is affixed, the dividing apparatus comprising:
   a holding table that holds the frame on a holding surface formed with an opening at a center thereof;
   a first camera that forms a first image to be used for identifying positions of the plurality of projected dicing lines, by imaging the wafer from a side of the first surface in a state in which the frame is held on the holding surface;
   a dividing unit that includes a pressing section configured to divide the wafer at a first projected dicing line that is one of the plurality of projected dicing lines by pressing a portion near the first projected dicing line from a side of the other of the first surface and the second surface;
   a second camera that forms a second image to be used for determining whether or not the wafer is divided at the first projected dicing line, by imaging the wafer from a side of the second surface in a state in which the frame is held on the holding surface; and
   a film disposing unit,
   wherein the film disposing unit includes:
      a supply section configured to supply a film between the pressing section and the wafer, and
      a collecting section configured to collect the film, and
   further wherein the supply section of the film disposing unit is positioned on one side of the pressing section and the collecting section of the film disposing unit is positioned on an opposite side of the pressing section such that the film comes into contact with the wafer at an area between the pressing section and the wafer when passing from the supply section to the collecting section.

9. A dividing apparatus that divides, at any one of a plurality of projected dicing lines set in a grid pattern, a wafer in which division initiating points are formed along the plurality of projected dicing line and one of a first surface and a second surface is affixed to a central area of a support member that has an outer circumferential area to which an annular frame is affixed, the dividing apparatus comprising:

a holding table that holds the frame on a holding surface formed with an opening at a center thereof;

a first camera that forms a first image to be used for identifying positions of the plurality of projected dicing lines, by imaging the wafer from a side of the first surface in a state in which the frame is held on the holding surface;

a dividing unit that includes a pressing section configured to divide the wafer at a first projected dicing line that is one of the plurality of projected dicing lines by pressing a portion near the first projected dicing line from a side of the other of the first surface and the second surface;

a second camera that forms a second image to be used for determining whether or not the wafer is divided at the first projected dicing line, by imaging the wafer from a side of the second surface in a state in which the frame is held on the holding surface; and a controller that controls the first camera, the dividing unit, and the second camera, wherein the controller includes a determination section configured to determine whether or not the wafer is divided at the first projected dicing line, in reference to the second image formed by the imaging performed by the second camera after the dividing unit is operated to divide the wafer at the first projected dicing line.

* * * * *